(12) United States Patent
Shirasaki

(10) Patent No.: US 8,349,526 B2
(45) Date of Patent: Jan. 8, 2013

(54) PELLICLE FOR LITHOGRAPHY

(75) Inventor: Toru Shirasaki, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 168 days.

(21) Appl. No.: 13/064,335

(22) Filed: Mar. 21, 2011

(65) Prior Publication Data
US 2011/0236807 A1 Sep. 29, 2011

(30) Foreign Application Priority Data

Mar. 26, 2010 (JP) ................................. 2010-071798

(51) Int. Cl.
G03F 1/64 (2012.01)
(52) U.S. Cl. ........................................................ 430/5
(58) Field of Classification Search ......... 430/5; 428/14
See application file for complete search history.

(56) References Cited

U.S. PATENT DOCUMENTS
5,834,143 A * 11/1998 Matsuoka et al. ................. 430/5

FOREIGN PATENT DOCUMENTS
JP 2002-182371 A 6/2002
JP 2002-182373 A 6/2002

* cited by examiner

Primary Examiner — Stephen Rosasco
(74) Attorney, Agent, or Firm — Manabu Kanesaka

(57) ABSTRACT

There is provided a pellicle for lithography which is capable of preventing or at least restricting the outgas from its mask-bonding agglutinant layer from entering the hollow of the pellicle by virtue of a unique structure of the mask-boding agglutinant layer, that is, the agglutinant layer is formed of two or more juxtaposed endless belts of which the inner-most belt that faces the pellicle hollow is made of a substance which is non-agglutinant while at least one of the other belts is agglutinant; when the outer-most belt is also made of a non-agglutinant substance, the outgas is completely prevented from escaping from the pellicle.

4 Claims, 2 Drawing Sheets

PELLICLE FOR LITHOGRAPHY

The present application claims priority from Japanese Application No. 2010-071798 filed on Mar. 26, 2010, the disclosure of which is hereby incorporated by reference herein in its entirety.

FIELD OF THE INVENTION

The present invention relates to a pellicle for lithography, in particular to a pellicle for lithography used as dust-proof protection in the manufacture of semiconductor devices such as LSI's and ultra-LSI's or the like.

BACKGROUND OF THE INVENTION

In manufacturing semiconductor devices such as LSI and super-LSI or in manufacturing a liquid crystal display board or the like, there is a process wherein a pattern is made by irradiating light to a semiconductor wafer or an exposure original plate for liquid crystal. On this occasion, a method is used whereby a surface of the exposure original plate is roofed by a pellicle bearing a pellicle membrane which transmits the light for exposure well, for the purpose of fending off the dust from the plate.

A typical conventional pellicle and a mask are shown in FIG. 1. In this figure, the reference numeral 1 designates the pellicle, 2 a pellicle frame, 3 a mask-bonding agglutinant, and 4 the mask (which can be a reticle).

In general a pellicle is built up of a pellicle frame, which is made of aluminum or a stainless steel or polyethylene or the like, and a transparent pellicle membrane made of cellulose nitrate or cellulose acetate or a fluorocarbon polymer or the like, which transmits light well; this membrane is attached to one of the two frame faces (hereinafter referred to as "membrane-receiving frame face" or "membrane-bearing frame face") by means of an adhesive made of a substance such as acrylic resin, epoxy resin and a fluorocarbon polymer; furthermore, on the other one of the two frame faces (hereinafter referred to as "mask-side frame face") is laid an agglutinant layer made of a polybutene resin, a polyvinyl acetate resin, an acrylic resin, a silicone resin or the like, and over this agglutinant layer is laid a releasable liner (separator) for protecting the agglutinant layer.

The pellicle has been designed to prevent the environmental dust from adhering to surfaces of the exposure original plate; in recent years, as the wavelengths of the exposure lights are shifted toward shorter sizes, the light energy is strengthened with shortening of the wavelengths so that the rapidity at which the agglutinant and the adhesive decompose as they are exposed to the lights is heightened so much that it became necessary to design a pellicle which has a structure such that the agglutinant and the adhesive are not exposed to the light or such that, even though the agglutinant and the adhesive are exposed to the light, the light-decomposed agglutinant or adhesive does not release a dusty particle into a space enclosed by the pellicle and the mask (ref. Publication-in-patent 1). At the same time, a demand for materials which do not easily decompose as they are exposed to such strong exposure lights exists; however, there has not been found a material that has qualities sufficiently answering the demand.

Consequently, a problem has arisen wherein, when a mask attached with a pellicle is used, a haze (incremental foreign material) is grown on the mask. The occurrence frequency of this problem has increased especially as the ArF has become the prevailing light source.

One cause for this problem is thought to be the out-gassing. In FIG. 2 is shown a situation wherein out gases 7 are released some into the space enclosed by the pellicle and the mask as shown by some of the broken arrow lines. The reference numeral 5 designates the pellicle membrane, and 6 the adhesive to bond pellicle membrane. The pellicle closed space (the space enclosed by the pellicle and the mask) is occupied by the out gases from the pellicle and other gases, and when the exposure light such as an ArF laser ray hits the out gases a photochemical reaction takes place and this may produce haze.

Among the out gases from the pellicle those from the mask-bonding agglutinant is the greatest in amount. This is because of the facts, among others, that the agglutinant is the largest in volume among the organic components of the pellicle, that the agglutinant contains low molecular weight elements or chemically unstable elements for better adhesiveness, and that the agglutinant is made of a material which is moderately easy to wash off, i.e., easy to chemically decompose with a view of easy detachment of the pellicle from the mask after use. There have been efforts to reduce the amount of the out gases from the agglutinant with a modicum of success, but so long as the agglutinant is made to have high adhesiveness, an epoch-making reduction in out-gassing is not foreseen.

List of Prior Art Publications

Publication-in-Patent

[Publication-in-patent 1] Japanese Published Patent Application 2002-182371

SUMMARY OF THE INVENTION

Problems the Invention Seeks to Solve

In view of the above-mentioned circumstances, it is an object of the present invention to propose a pellicle having an improved structure in a sense that a decomposed matter released from the agglutinant or the adhesive as the exposure light or irregularly reflected light decomposes the agglutinant or the adhesive does not enter the space enclosed by the pellicle and the mask.

Means to solve the Problems

The pellicle for lithography according to the present invention is characteristic in that an agglutinant layer for bonding the pellicle onto a mask consists of at least two sections, one of said at least two sections being an inner-most section made of a non-agglutinant (non-adhesive) rubber which faces a hollow of the pellicle, and at least one of the other sections being made of an agglutinant (adhesive) rubber.

Also, the pellicle for lithography according to the present invention can be one which is characteristic in that, while the inner-most section is made of a non-agglutinant rubber, an outer-most section of the agglutinant layer is made of an agglutinant rubber which faces the outer space.

Also, the pellicle for lithography according to the present invention can be one which is characteristic in that the agglutinant layer consists of at least three sections, of which the inner-most section and the outer-most section are made of a non-agglutinant rubber, and at least one of the other sections is made of an agglutinant rubber.

RESULT OF THE INVENTION

As a result of the present invention, it is now possible to substantially reduce the amount of the gas released from the agglutinant layer into the pellicle hollow.

EXAMPLES TO EMBODY THE INVENTION

The present inventor conceived an idea of constructing the mask-bonding agglutinant layer which consists of two kinds of juxtaposed belts, one kind of belt(s) having agglutinant force and the other kind of belt(s) having substantially weak or no agglutinant force (hereinafter collectively referred to as "non-agglutinant belt"); then, after a succession of various experiments, the inventor came to realize that the amount of the gas that is released from a non-agglutinant resin (rubber) is by far smaller than that released from an agglutinant resin.

In a preparatory experiment; a resin in an amount of 0.2 g is placed in a sample tube, and the sample tube was heated at 50 degrees centigrade while nitrogen gas was passed through the tube at a flow rate of 100 milliliters per minute, and the gases that came out of the tube were captured for thirty minutes in an in-take tube, and then the captured gases were analyzed by gas chromatography; the result was that in the case of conventionally used agglutinant substances (such as the silicone resins of KR series manufactured by Shin-Etsu Chemical Co., Ltd.), 400 nanograms of out gas was detected and in the case of non-agglutinant rubber substances (such as the silicone rubbers of KE series manufactured by Shin-Etsu Chemical Co., Ltd.), less than 10 nanograms of out gas was detected.

In order to be affixed onto a mask a pellicle's agglutinant layer must have sufficient adhesiveness. Thus, the mask-bonding agglutinant layer is hybridized to consist of a portion (belt) having an adhesive (agglutinant) characteristic and another portion having a non-adhesive (non-agglutinant) characteristic, wherein the non-adhesive portion is designed to work as a gas barrier and the adhesive portion is designed to agglutinate the pellicle to the mask.

As it is important that no gas is released into the pellicle hollow, which is closed by the mask, the agglutinant layer may be made to have two belts, for example, in a manner such that the inner belt is made of a non-agglutinant substance and the outer belt is made of an agglutinant substance whereby the gases released from the agglutinant belt are prevented by the non-agglutinant belt from entering the closed pellicle hollow.

Figure 1:
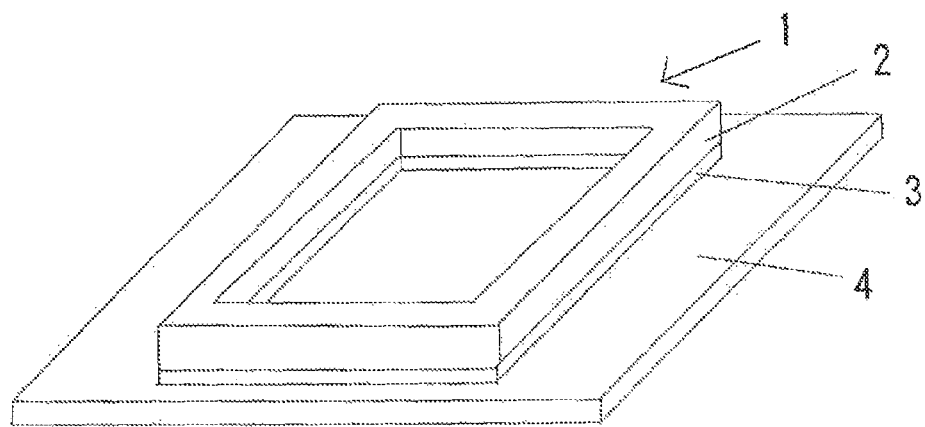
FIG. 1 is a perspective view of a conventional pellicle laid on mask.
Figure 2:
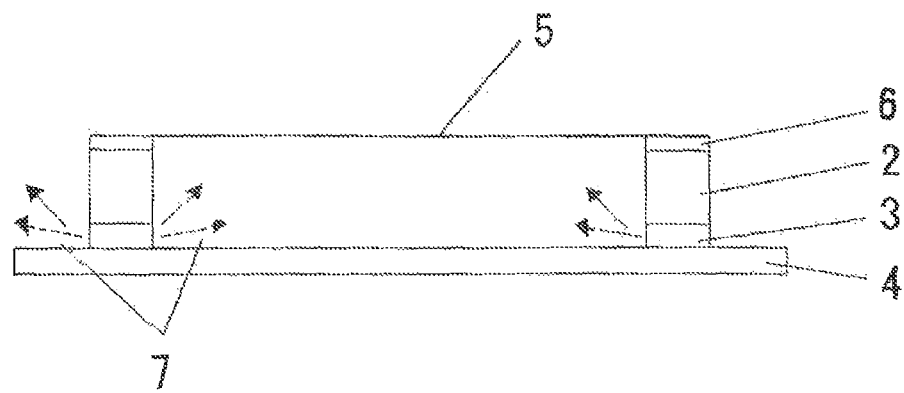
FIG. 2 is a conceptual cross-sectional view illustrating the release of gas from a conventional pellicle.
Figure 3:
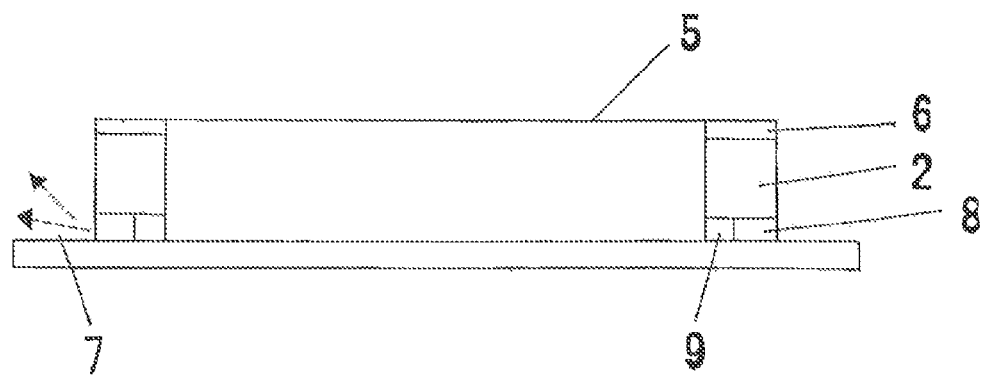
FIG. 3 is a conceptual cross-sectional view illustrating the fabric of an example of the invented pellicle.

An example of the invented pellicle is illustrated in FIG. 3. The to reference numeral 8 designates an agglutinant belt of a mask-bonding agglutinant layer and 9 designates a non-agglutinant rubber belt.

Figure 4:
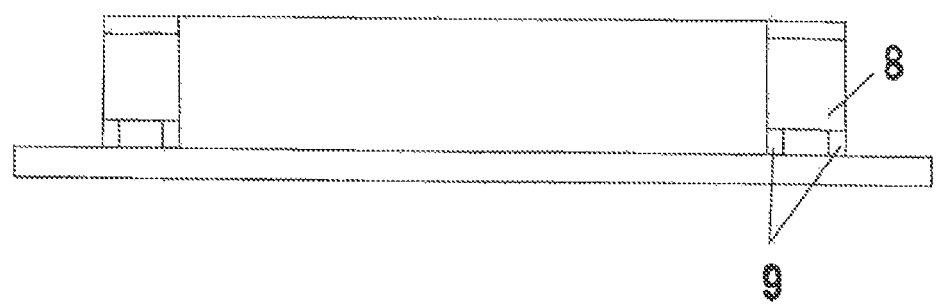
FIG. 4 is a conceptual cross-sectional view illustrating the fabric of another example of the invented pellicle.

It is also good to fabricate the agglutinant layer out of three juxtaposed belts in a manner such that the inner-most and the outer-most belts are made of a non-agglutinant substance and the sandwiched middle belt is made of an agglutinant substance, whereby the pellicle does not release an out gas not only into the pellicle hollow but also into the external space, as shown in FIG. 4, which illustrates this another embodiment of the pellicle.

The substance that makes the non-agglutinant belt(s) of the agglutinant layer is preferably a resilient material and such material has preferably a low resiliency so that the mask is not distorted when the pellicle is affixed to the mask.

Examples include a silicone rubber, a fluorocarbon rubber, an acrylic rubber, a nitrile rubber, and among these, silicone rubber and fluorocarbon rubber are more preferred.

The substance that makes the agglutinant belt(s) of the agglutinant layer can be any that has been used to make the conventional agglutinant layer and more preferable examples include a silicone resin agglutinant and an acrylic resin agglutinant.

EXAMPLES

Herein below, some experiments and comparative experiments are described, but these are not to be deemed to restrict the meaning of to the present invention.

Experiment 1

A pellicle frame made of an aluminum alloy (of which the side lengths were 149 mm and 122 mm, the height 5.8 mm, and the frame bar width 2 mm) was washed in pure water; then, a silicone rubber "KE-1204," which is a non-agglutinant rubber manufactured by Shin-Etsu Chemical Co., Ltd., was applied to an inner part of one frame face of the pellicle frame along the entire inner edge of the frame face, i.e., endlessly; immediately thereafter the pellicle frame was heated at 150 degrees centigrade by means of electromagnetic induction heating. On this occasion the width of the non-agglutinant belt was 1 mm.

Subsequently, the entirety of the remainder of the frame face was coated with a silicone agglutinant "KR-3700," which is an agglutinant paste manufactured by Shin-Etsu Chemical Co., Ltd.; immediately thereafter the pellicle frame was heated at 150 degrees centigrade by means of electromagnetic induction heating. The width of the agglutinant belt was 1 mm.

Onto the other frame face was applied a 6-percent solution of "CITOP CTX-A," which is an adhesive paste manufactured by ASAHI GLASS CO., LTD., prepared by dissolving the paste in perfluorotributylamine; then the pellicle frame was heated at 130 degrees centigrade to thereby harden the adhesive.

A 3-percent solution of "CITOP CTX-S," a commercial product of ASAHI GLASS CO., LTD., was prepared by dissolving the "CITOP CTX-S" in perfluorotributylamine, and was dropped on a middle part of a silicon wafer substrate; the silicon wafer was rotated at a revolving speed of 760 rpm whereupon the solution was spread over the surface of the silicon wafer and formed a film coat. The substrate was left alone at the room temperature for a while, and then heated at 180 degrees centigrade to cause the solvent to evaporate, whereupon a pellicle membrane was formed. This pellicle membrane was peeled off the surface of the silicon wafer and the pellicle membrane was completed.

Thereafter, the pellicle frame was pasted to the pellicle membrane by its adhesive-bearing frame face; that part of the pellicle membrane which extended beyond the outer edge of the pellicle frame face was removed and a pellicle of the present invention was completed. It is reminded that the agglutinant layer for bonding the pellicle onto a mask is composed of an inner non-agglutinate belt and an outer agglutinant belt.

This pellicle was bonded on a mask, and was exposed to an ArF laser. No incremental foreign material was generated on the mask after an irradiation of 10 kJ/cm$^2$.

Experiment 2

A pellicle frame made of an aluminum alloy (of which the side lengths were 149 mm and 122 mm, the height 5.8 mm, and the frame bar width 2 mm) was washed in pure water; then, a silicone rubber "KE-1204," which is a non-agglutinant rubber manufactured by Shin-Etsu Chemical Co., Ltd., was applied to an inner part of one frame face of the pellicle frame along the entire inner edge of the frame face and to an outer part of the same frame face along the entire outer edge of the frame face; immediately thereafter the pellicle frame was heated at 150 degrees centigrade by means of electromagnetic induction heating. On this occasion the widths of the resulting inner non-agglutinant belt and the outer non-agglutinant belt were both 0.5 mm, and that part of the frame face which was between the two belts was free of a coating material.

Thereafter, a silicone agglutinant "KR-3700," manufactured by Shin-Etsu Chemical Co., Ltd., was applied to the central part of the frame face between the two belts of the non-agglutinant rubber, which was immediately followed by a heating of the pellicle frame at 150 degrees centigrade by electromagnetic induction heating. On this occasion, the width of the newly made agglutinant belt measured 1 mm.

Onto the other frame face was applied a 6-percent solution of "CITOP CTX-A," which is an adhesive paste manufactured by ASAHI GLASS CO., LTD., prepared by dissolving the paste in perfluorotributylamine; then the pellicle frame was heated at 130 degrees centigrade to thereby harden the adhesive.

A 3-percent solution of "CITOP CTX-S," a commercial product of ASAHI GLASS CO., LTD., was prepared by dissolving the "CITOP CTX-S" in perfluorotributylamine, and was dropped on a middle part of a silicon wafer substrate; the silicon wafer was rotated at a revolving speed of 760 rpm whereupon the solution was spread over the surface of the silicon wafer and formed a film coat. The substrate was left alone at the room temperature for a while, and then heated at 180 degrees centigrade to cause the solvent to evaporate, whereupon a pellicle membrane was formed. This pellicle membrane was peeled off the surface of the silicon wafer and the pellicle membrane was completed.

Thereafter, the pellicle frame was pasted to the pellicle membrane by its adhesive-bearing frame face; that part of the pellicle membrane which extended beyond the outer edge of the pellicle frame face was removed and a pellicle of the present invention was completed. It is reminded that the agglutinant layer for bonding the pellicle onto a mask is composed of an inner non-agglutinate belt, a central agglutinant belt, and an outer non-agglutinant belt.

This pellicle was bonded on a mask, and was exposed to an ArF laser. No incremental foreign material was found to generate on the mask after an irradiation of 10 kJ/cm$^2$.

Comparative Experiment

A pellicle frame made of an aluminum alloy (of which the side lengths were 149 mm and 122 mm, the height 5.8 mm, and the frame bar width 2 mm) was washed in pure water; then, a silicone agglutinant "KR-3700," which is an agglutinant paste manufactured by Shin-Etsu Chemical Co., Ltd., was applied to an outer part of one of the frame faces of the pellicle frame along the entire outer edge of the frame face; immediately thereafter the pellicle frame was heated at 150 degrees centigrade by means of electromagnetic induction heating.

Onto the other frame face, opposite to the one bearing the agglutinant, was applied a 6-percent solution of "CITOP CTX-A," which is an adhesive paste manufactured by ASAHI GLASS CO., LTD., prepared by dissolving the paste in perfluorotributylamine; then the pellicle frame was heated at 130 degrees centigrade to thereby harden the adhesive.

A 3-percent solution of "CITOP CTX-S," a commercial product of ASAHI GLASS CO., LTD., was prepared by dissolving the "CITOP CTX-S" in perfluorotributylamine, and was dropped onto a middle part of a silicon wafer substrate; the silicon wafer was rotated at a revolving speed of 760 rpm whereupon the solution was spread over the surface of the silicon wafer and formed a film coat. The substrate was left alone at the room temperature for a while, and then heated at 180 degrees centigrade to cause the solvent to evaporate, whereupon a pellicle membrane was formed. This pellicle membrane was peeled off the surface of the silicon wafer and the pellicle membrane was completed.

Thereafter, the pellicle frame was pasted to the pellicle membrane by its adhesive-bearing frame face; that part of the pellicle membrane which extended beyond the outer edge of the pellicle frame face was removed and a pellicle of the present invention was completed.

This pellicle was bonded on a mask, and was exposed to an ArF laser. Some incremental foreign materials were found to generate on the patterning face of the mask after an irradiation of 10 kJ/cm$^2$.

Explanation of Reference Numerals

1: pellicle
2: pellicle frame
3: mask-bonding agglutinant
4: mask
5: pellicle membrane
6: adhesive to bond pellicle membrane
7: outgas from mask-bonding agglutinant
8: mask-bonding agglutinant layer
9: non-agglutinant belt What are claimed are:

1. A pellicle for lithography comprising a pellicle frame and a pellicle membrane bonded on one of two frame faces of said pellicle frame and an agglutinant layer provided on another one of the two frame faces of said pellicle frame for bonding the pellicle onto a mask, wherein said agglutinant layer consists of at least two sections, one of said at least two sections being an inner-most section made of a non-agglutinant material which faces a hollow of the pellicle, and at least one of the other sections being made of an agglutinant material.

2. A pellicle as claimed in claim 1, wherein an outer-most section of the agglutinant layer is made of an agglutinant material which faces the outer space.

3. A pellicle as claimed in claim 1, wherein the agglutinant layer consists of at least three sections, of which the inner-most section and the outer-most section are made of a non-agglutinant material, and at least one of the other sections is made of an agglutinant material.

4. A pellicle as claimed in claim 1, wherein said agglutinant material and non-agglutinant material are different rubbers.

* * * * *